United States Patent
Park et al.

(10) Patent No.: US 6,884,694 B2
(45) Date of Patent: Apr. 26, 2005

(54) METHOD OF FABRICATING NANO SOI WAFER AND NANO SOI WAFER FABRICATED BY THE SAME

(75) Inventors: Jea-Gun Park, Seongnam (KR); Gon-Sub Lee, Seoul (KR); Sang-Hee Lee, Busan (KR)

(73) Assignees: Jea Gun Park, Kyungki-do (KR); Siltron Inc., Kyungsangbuk-do (KR)

( * ) Notice: Subject to any disclaimer, the term of this patent is extended or adjusted under 35 U.S.C. 154(b) by 0 days.

(21) Appl. No.: 10/391,297

(22) Filed: Mar. 19, 2003

(65) Prior Publication Data

US 2004/0029358 A1 Feb. 12, 2004

(30) Foreign Application Priority Data

Aug. 10, 2002 (KR) .................................... 2002-0047351

(51) Int. Cl.[7] .............................................. H01L 21/30
(52) U.S. Cl. ...................... 438/455; 438/458; 438/459; 438/479
(58) Field of Search ................ 438/455, 458, 438/459, 480, 479

(56) References Cited

U.S. PATENT DOCUMENTS

| | | | | |
|---|---|---|---|---|
| 5,131,968 A | * | 7/1992 | Wells et al. ................ | 156/153 |
| 5,966,620 A | * | 10/1999 | Sakaguchi et al. .......... | 438/455 |
| 6,287,941 B1 | * | 9/2001 | Kang et al. .................. | 438/459 |
| 6,323,108 B1 | * | 11/2001 | Kub et al. .................... | 438/458 |
| 6,524,935 B1 | * | 2/2003 | Canaperi et al. ............ | 438/478 |
| 6,534,380 B1 | * | 3/2003 | Yamauchi et al. .......... | 438/455 |
| 6,566,233 B2 | * | 5/2003 | Yokokawa et al. ......... | 438/455 |

* cited by examiner

Primary Examiner—Michael Trinh
(74) Attorney, Agent, or Firm—Rothwell, Figg, Ernst & Manbeck, P.C.

(57) ABSTRACT

A method of fabricating a nano silicon on insulator (SOI) wafer having an excellent thickness evenness without performing a chemical mechanical polishing (CMP) and a wafer fabricated by the same are provided. The provided method includes preparing a bond wafer and a base wafer, and forming a dielectric on at least on surface of the bond wafer. Thereafter, an impurity ion implantation unit is formed by implanting impurity ions into the bond wafer to a predetermined depth from the surface of the bond wafer at a low voltage. The dielectric of the bond wafer and the base wafer contact each other in order to be bonded. Next, a thermal process of low temperature is performed to cleave the impurity ion implantation unit of the bond wafer. In addition, the cleaved surface of the bond wafer bonded to the base wafer is etched to form a nano scale device region. Here, the cleaved surface may be etched by performing a hydrogen surface process and a wet etching.

27 Claims, 10 Drawing Sheets

METHOD OF FABRICATING NANO SOI WAFER AND NANO SOI WAFER FABRICATED BY THE SAME

Priority is claimed to Patent Application No. 2002-47351 filed in Republic of Korea on Aug. 10, 2002, herein incorporated by reference.

BACKGROUND OF THE INVENTION

1. Field of the Invention

The present invention relates to a method of fabricating a silicon on insulator (SOI) wafer and an SOI wafer fabricated by the same, and more particularly, to a method of fabricating a nano SOI wafer with a device region having a nano thickness and a nano SOI wafer fabricated by the same.

2. Description of the Related Art

In a bulk silicon substrate used for a general silicon integrated circuit, since a junction breakdown occurs in a junction isolation under a supply voltage of plus or minus 30 V when proper doping amount and dimension are provided, it is improper to apply a high voltage. In addition, the junction isolation is not effective under a high radioactivity environment due to a transient photocurrent generated in a p-n junction according to gamma rays. Accordingly, a silicon on insulator (SOI) technique where an insulator completely surrounds a device is developed instead of the p-n junction. A circuit fabricated in such an SOI substrate requires a simpler fabricating process and a simpler resultant structure compared to a circuit fabricated in a bulk silicon substrate so that a chip size may be reduced. In addition, a parasitic capacitance is reduced along with the chip size so that the operation speed of the circuit increases.

Such an SOI technique includes a silicon on sapphire (SOS) technique, where a hetero epitaxial silicon layer is grown on a sapphire, a separation by implanted oxygen (SIMOX) technique, where oxygen ions are implanted into a silicon substrate and annealed to form a buried silicon oxide layer, and a bonding SOI technique, where at least one wafer having a dielectric on a surface and the other wafer are bonded.

Figure 1:
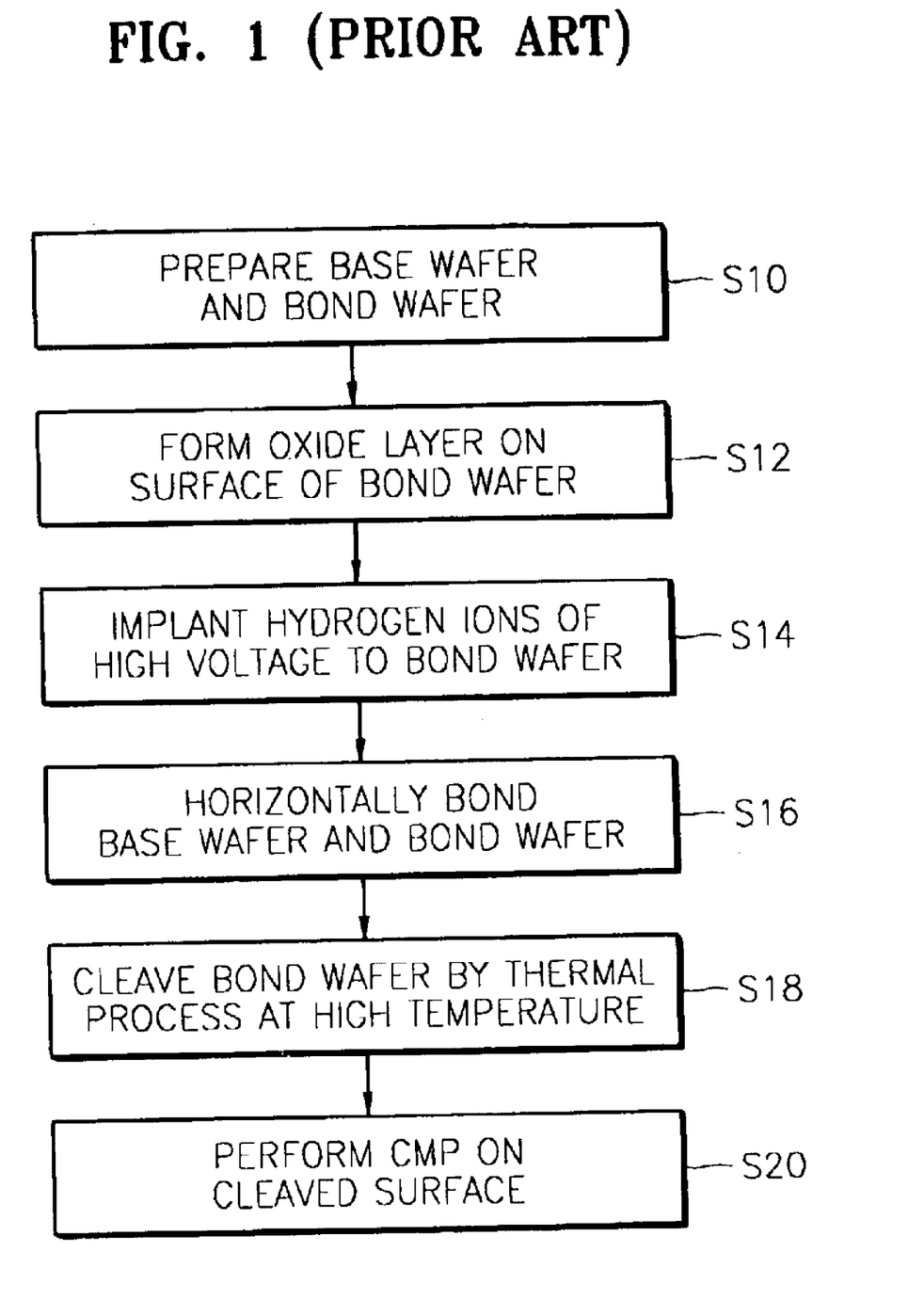
FIG. 1 illustrates a method of fabricating a silicon on insulator (SOI) wafer using a conventional smart-cut process.

A well known example using the bonding SOI technique is a smart-cut process which is used for fabricating a unibond wafer. In the smart-cut process, hydrogen ions are implanted into one of the wafers to be bonded, a fine bubble layer is formed, and a wafer is cleaved with respect to the bubble layer by a thermal process. FIG. 1 illustrates processes for fabricating an SOI wafer using a conventional smart-cut process.

Referring to FIG. 1, a base wafer and a bond wafer, that will be bonded in a subsequent process, are prepared in step S10. The base wafer, referred to as a handling wafer, physically supports an SOI wafer. The bond wafer is a wafer, referred to as a device wafer, on which channels of a semiconductor device will be formed.

Thereafter, a thermal oxidization process is performed on the bond wafer formed of mono-crystalline silicon to form an oxide layer, i.e., a silicon oxide layer, on the surface of the bond wafer in step S12. The silicon oxide layer performs as a buried oxide layer (BOX) in the SOI wafer. Here, the silicon oxide layer may be formed to a thickness of about tens to thousands of Å when necessary.

Hydrogen ions of high voltage are implanted into the bond wafer in step S14. Here, the acceleration voltage of the hydrogen ions is about 125 KeV, and a hydrogen dose amount is about $6 \times 10^{16}$ cm$^{-2}$. Accordingly, a hydrogen ion implantation unit having a projection range distance (Rp) is formed under the surface of the bond wafer, beneath the silicon oxide layer, to a predetermined depth.

Next, the base wafer and the bond wafer are cleaned to remove contaminants from the surfaces of the wafers and the wafers are horizontally bonded in step S16. Here, the base wafer is horizontally laid and the silicon oxide layer portion of the bond wafer is placed above the base wafer to be parallel with the base wafer. Thereafter, the bond wafer is lowered at a room temperature so that the surfaces of the wafers simultaneously contact each other and bond together. Here, the wafers are bonded by a hydrogen bond under a hydrophillic condition.

Subsequently, the hydrogen ion implantation portion is cleaved by a thermal process performed at a high temperature in step S18. The thermal process is performed under a nitrogen atmosphere at a temperature of about 550° C. for about one hour. Accordingly, bubbles in the hydrogen ion implantation portion are interacted in the thermal process to form a sufficient amount of blisters and the blisters are spread to generate a flake occurrence so that the cleavage occurs. After the cleavage process, the amount of root mean square roughness (rms) value on the surface of the silicon layer remaining on the bond wafer is about 100 to 120 Å and the thickness of the remaining silicon layer is about 9000 Å.

A chemical mechanical polishing (CMP) is performed on the cleaved surface of the silicon layer in step S20. Here, the CMP is performed until the thickness of the device region, on which channels of the semiconductor device will be formed, becomes a desired thickness.

Meanwhile, as it is required for a semiconductor device formed on an SOI wafer to be highly integrated and operated at a high speed, and use a low amount of electric power, the thickness of a device region or a channel region of a semiconductor device in the SOI wafer becomes smaller. In addition, the thickness of a BOX becomes smaller. Accordingly, a thick SOI wafer with a device region or a channel region in the silicon SOI wafer having a thickness to about more than 1000 nm is used for forming MEMS, sensors, photodiodes, or bipolar power devices, and a thin SOI with a device region having a thickness to about 50 to 1000 nm can be used for forming micro displays or partially depleted CMOSs. However, a fully depleted CMOS, a nano CMOS device, or a single-electron device requires a nano SOI wafer with a device region having a thickness of about less than 50 nm.

A method of fabricating a nano SOI wafer by using a conventional smart-cut process has a plurality of disadvantages as follows.

In the conventional method, a hydrogen ion implantation unit of a bond wafer has to be cleaved, a cleaved surface has to be planarized, and a CMP has to be performed on the cleaved surface until a device region has a desired thickness. However, a CMP is a time and money consuming process, and the thickness of a central portion and the thickness of a peripheral portion of a wafer are deviated by the CMP. In addition, the CMP may generate cracks.

Since hydrogen ions are implanted into a bond wafer in a high-energy voltage environment, the projection range distance of the hydrogen ions remarkably increases so that a thick silicon layer having a thickness of about 9000 Å is remained after a subsequent cleavage process. Accordingly, the CMP requires large amounts of time and silicon layer to fabricate a nano SOI wafer with a device region having a thickness of about 50 nm, i.e., 500 Å.

In addition, a conventional horizontal bonding process, in which a bond wafer and a base wafer are bonded, generates defects such as voids on a bonding surface.

SUMMARY OF THE INVENTION

To solve the above-described problems, it is a first objective of the present invention to provide a method of fabricating a nano silicon on insulator (SOI) wafer having uniform thickness without performing a chemical mechanical polishing (CMP).

It is a second objective of the present invention to provide a method of fabricating a nano SOI wafer having improved bonding force between a bond wafer and a base wafer by preventing voids to be formed between the bonding surfaces of the wafers.

It is a third objective of the present invention to provide a nano SOI wafer fabricated by a method of fabricating a nano SOI wafer according to the present invention.

To accomplish the first objective of the present invention, a method of fabricating a nano SOI includes preparing a bond wafer and a base wafer and forming a dielectric on at least one surface of the bond wafer. Thereafter, an impurity ion implantation unit is formed by implanting impurity ions into the bond wafer to a predetermined depth from the surface of the bond wafer at a low voltage. The dielectric of the bond wafer and the base wafer contact each other to be bonded. Next, a thermal process of low temperature is performed to cleave the impurity ion implantation unit of the bond wafer and the cleaved surface of the bond wafer bonded to the base wafer is etched to form a nano scale device region.

Here, the bond wafer is a mono-crystalline silicon wafer and a silicon germanium layer may be further formed on the bond wafer, preferably by an epitaxial process, before forming the dielectric on the bond wafer. In addition, the dielectric formed on the bond wafer may be a silicon oxide layer formed by a thermal process.

The impurity ions are hydrogen ions and the hydrogen ions are implanted at a low voltage of less than 30 KeV. It is preferable that the projection range distance (Rp) of the implanted hydrogen ions is formed near the surface of the bond wafer, for example, in a range from 1000 to 4000 Å. Here, the Rp can be adjusted by controlling the voltage of the ion implantation.

It is preferable that the bond wafer and the base wafer are bonded by contacting at least one portions of the bond wafer and the base wafer and sequentially increasing the contacting area to bond the wafers and reduce the generation of voids. For example, at least one lower portions of the bond wafer and the base wafer contact and the contacting area sequentially increases in an upper direction to press and bond the wafers.

The impurity ion implantation unit of the bond wafer is cleaved by thermally processing at a low temperature of less than 400° C. It is preferable that the root mean square roughness (rms) value on the cleaved surface of the bond wafer is 30 to 40 Å. It is preferable that the bond wafer bonded to the base wafer is maintained at a thickness of less than 3000 Å in cleaving the bond wafer.

Meanwhile, the cleaved surface of the bond wafer to form the device region is etched by wet etching the cleaved surface of the bond wafer bonded to the base wafer and performing a hydrogen thermal process on the surface of the wet etched bond wafer. Here, it is preferable that the hydrogen thermal process is performed on the cleaved surface of the bond wafer before the cleaved surface of the bond wafer bonded to the base wafer is wet etched in order to wet etch the cleaved surface of the bond wafer. Here, the hydrogen thermal process on the surface of the bond wafer is performed at a temperature higher than 1100° C. for at least one minute.

It is preferable that the cleaved surface of the bond wafer bonded to the base wafer is wet etched by using a mixed solution of $NH_4OH$, $H_2O_2$, and $H_2O$ as an etch solution to reduce an etch speed and control the etch thickness to be uniform.

A nano SOI wafer fabricated by the method according to the present invention includes a device region having a thickness of less than 50 nm and the rms value of the surface of the device region is less than 2 Å.

According to the present invention, the Rp of hydrogen ions is reduced and $\Delta Rp$ that decides the distribution of the hydrogen ion implantation unit is reduced according to the ion implantation at a low voltage so that the rms value on the cleaved surface is reduced in a cleavage process. Therefore, a nano device region can be formed by a thermal process of hydrogen ions and a wet etching without performing a CMP process.

According to the present invention, a bond wafer and a base wafer are bonded while increasing the contacting area of the wafers so that the number of voids on the contact surface is reduced to improve bonding force of the wafers.

According to the present invention, the rms value on the cleaved surface is reduced by performing a cleavage process at a low temperature so that a nano scale device region is formed by using only the thermal process of hydrogen ions and wet etching. In addition, the out-diffusion of the hydrogen ions is low by performing the cleavage process at the low temperature. Therefore, it is not necessary to increase a dose amount of hydrogen ions in order to maintain hydrogen ion density enough to generate blisters and flake occurrence so that the producing cost is lowered.

Furthermore, the rms value on the cleaved surface is remarkably reduced by the hydrogen thermal process on the cleaved surface so that a desired surface roughness for a nano scale SOI wafer can be attained. In addition, since the hydrogen thermal process is additionally performed on the cleaved surface before the wet etching process, the wet etching process can be efficiently performed.

In addition, the etch thickness can be made uniform by maintaining the surface etch amount of the cleaved surface at a low level while not performing the CMP process.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown.

Figure 2:
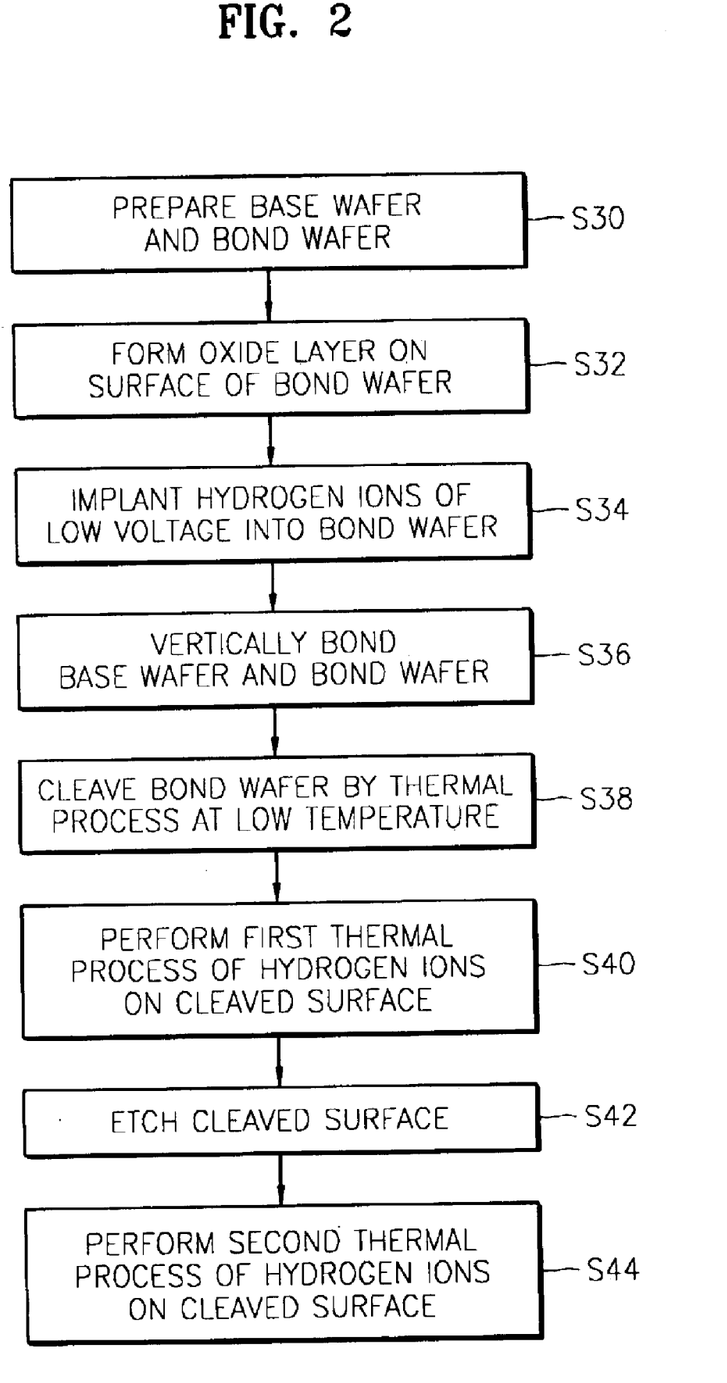
FIG. 2 illustrates a method of fabricating a nano SOI wafer according to a first embodiment of the present invention.

FIG. 2 illustrates a method of fabricating a nano silicon on insulator (SOI) wafer according to a first embodiment of the present invention, and FIGS. 3 through 7 are sectional views illustrating the method of fabricating a nano SOI wafer according to the first embodiment of the present invention.

Referring to FIGS. 2 through 7, a base wafer 20 and a bond wafer 10 that will be bonded in a subsequent process are prepared in step S30. The base wafer 20, referred to as a handling wafer, physically supports an SOI wafer. The bond wafer 10 is referred to as a device wafer on which channels of a semiconductor device will be formed.

Figure 3:
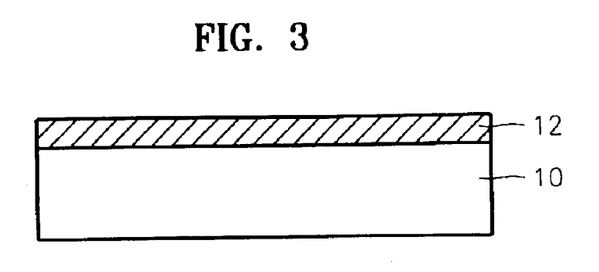
FIGS. 3 through 7 are sectional views illustrating the method of fabricating a nano SOI wafer according to the first embodiment of the present invention.
Figure 4:
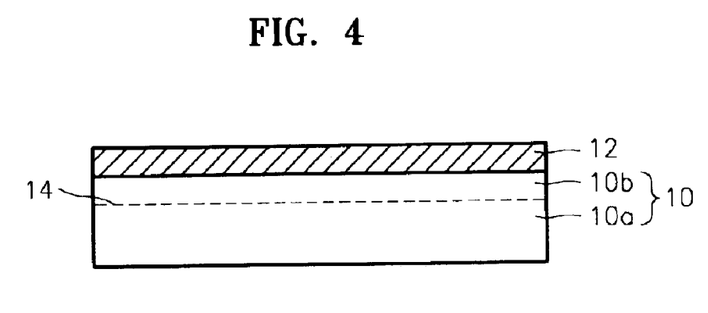
Figure 5:
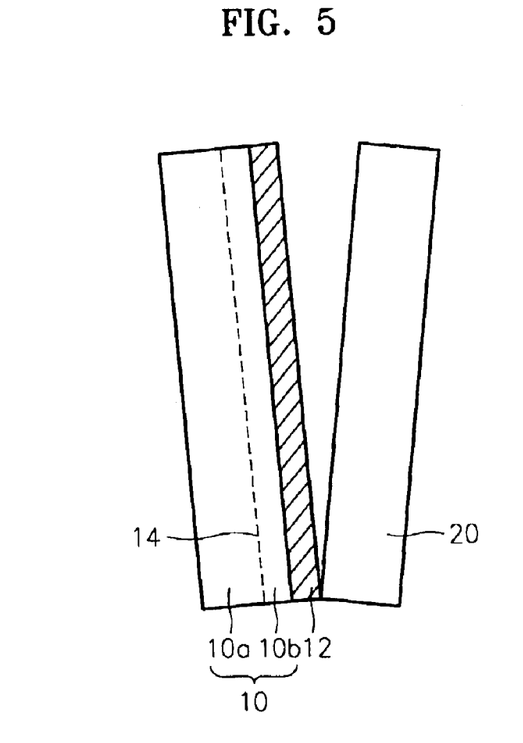

Thereafter, a dielectric is formed on at least one surface of the bond wafer 10 formed of mono-silicon by a plurality of conventional methods. For example, an oxide layer, i.e., a silicon oxide layer 12, is formed on the surface of the bond wafer 10 by performing a thermal oxidization process in step S32. The silicon oxide layer 12 performs as a buried oxide (BOX) layer on the surface of the bond wafer 10. Here, the silicon oxide layer 12 may be formed to a thickness of about tens to thousands of Å when necessary, however, the silicon oxide layer 12 is formed in a nano SOI wafer to a thickness of tens to hundreds of Å, for example, of 200 Å.

Even though the silicon oxide layer 12 is formed on the upper surface of the bond wafer 10 in FIG. 3, the silicon oxide layer 12 may be formed on the entire surfaces of the bond wafer 10, which are exposed by the thermal oxidization process. When necessary, the silicon oxide layer 12 may remain on the entire surfaces of the bond wafer 10 or remain on only one surface of the bond wafer 10.

Impurity ions of low voltage, for example, hydrogen ions, are implanted into the bond wafer 10 in step S34. Here, an acceleration voltage (Vac) of the hydrogen ions is about 25 KeV and a hydrogen dose amount is about $6 \times 10^{16}$ $cm^{-2}$ in the present embodiment. Accordingly, a hydrogen ion implantation unit 14 having a projection range distance (Rp) is formed under the surface of the bond wafer 10, beneath the silicon oxide layer 12 to a predetermined depth. Here, the bond wafer 10 is separated into a device forming unit 10b and a removal unit 10a with respect to the hydrogen ion implantation unit 14. Although the hydrogen ion implantation unit 14 is illustrated as a dotted line in FIG. 4, the hydrogen ion implantation unit 14 denotes a region with a predetermined width, in which hydrogen ions are distributed.

In the present invention, the relationship among the Vac of the impurity ions, the Rp, and the change of Rp (ΔRp) is simulated. Here, a silicon substrate includes a silicon oxide layer having a thickness of 200 Å is used as a hydrogen ion implantation sample, and the hydrogen ion dose amount is set at $6 \times 10^{16}$ $cm^{-2}$. Table 1 illustrates the simulation results.

TABLE 1

| Acceleration voltage (KeV) | 10 | 20 | 30 | 50 | 75 | 100 | 150 | 200 |
|---|---|---|---|---|---|---|---|---|
| Rp (nm) | 180.8 | 299.4 | 389.6 | 542.4 | 718 | 900 | 1300 | 1780 |
| ΔRp (nm) | 55.9 | 73.1 | 81.5 | 91.5 | 99.3 | 106.6 | 120.3 | 129.5 |

Figure 12:
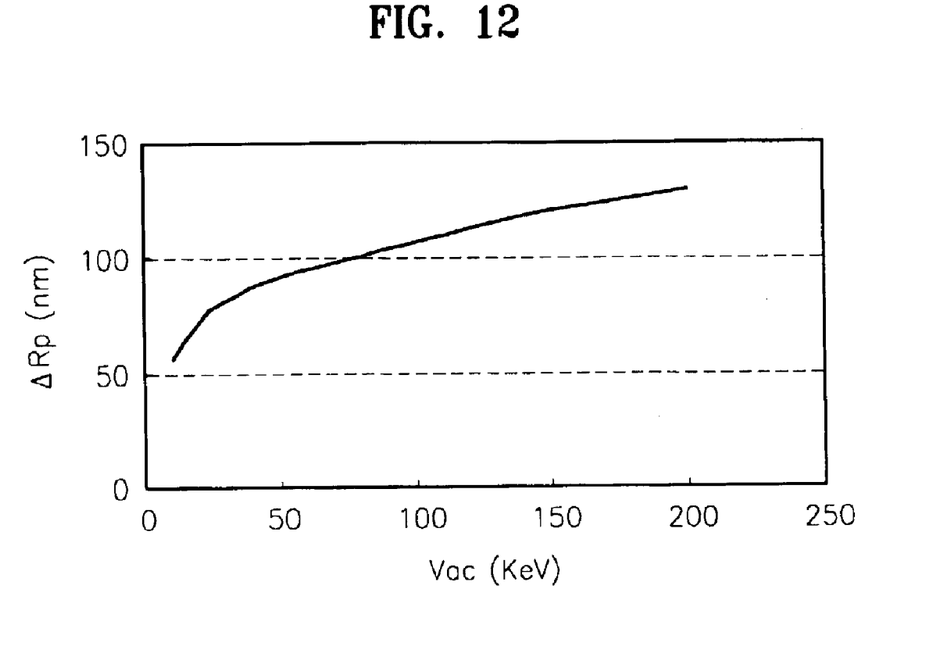
FIG. 12 is a graph illustrating a relationship between a hydrogen ion implantation voltage and $\Delta Rp$ measured in an experiment for fabricating a nano SOI wafer according to the first embodiment of the present invention.

According to Table 1, the Rp is reduced proportionally with the decrease of the Vac of the hydrogen ions. Although the ΔRp is reduced according to the decrease of the ion Vac, the ΔRp is remarkably reduced when the ion Vac is lower than 50 KeV, in particular, lower than 30 Kev. This will be illustrated clearer with reference to FIG. 12. In FIG. 12, the x-axis denotes the Vac of the hydrogen ions and the y-axis denotes the ΔRp.

In addition, the ΔRp is measured by using SIMS after the hydrogen ions are implanted in order to define the relationship between ΔRp and rms. The rms values (10 μm×10 μm) after a cleavage process of the hydrogen ion implantation unit 14 is measured by using AFM, and illustrated in Table 2.

TABLE 2

| Vac (Kev) | 26 | 42 | 45.2 |
|---|---|---|---|
| ΔRp (nm) | 77 | 87 | 88 |
| rms (nm) | 3.16 | 5.72 | 16.55 |

Figure 13:
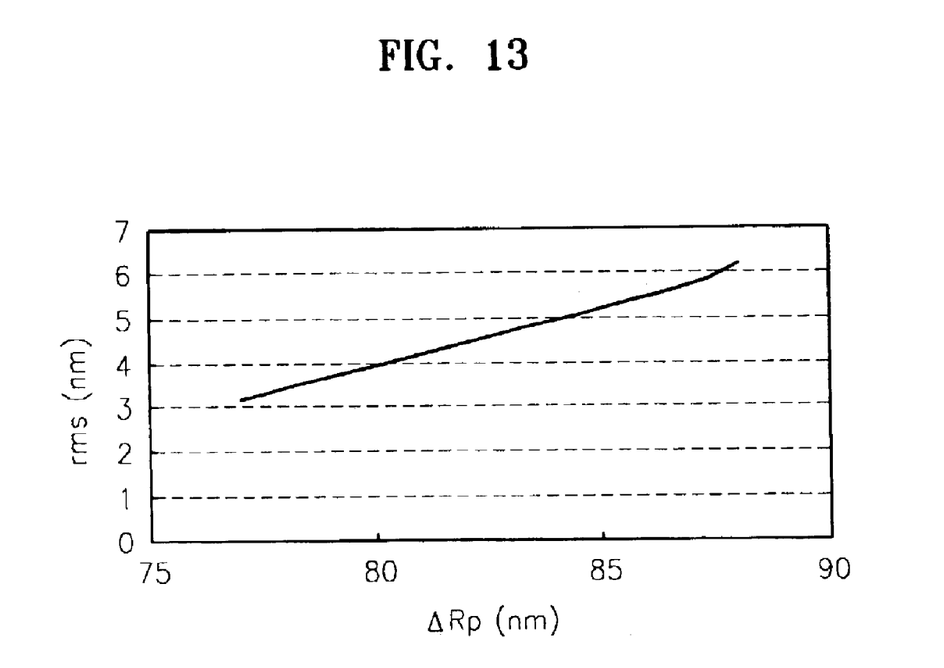
FIG. 13 is a graph illustrating a relationship between ΔRp and the root mean square roughness (rms) value measured in an experiment for fabricating a nano SOI wafer according to the first embodiment of the present invention.

Referring to Table 2, the ΔRp and the rms value increase according to the increase of the Vac of the hydrogen ions. The relationship between the ΔRp and the rms value is illustrated in FIG. 13. In FIG. 13, the x-axis denotes the ΔRp and the y-axis denotes the rms.

Referring to FIGS. 12 and 13, the Rp increases according to the increase of the Vac of the hydrogen ions. Accordingly, the ΔRp increases and the rms value increases with a predetermined relationship. Based on the simulation and the results of the experiments, it is preferable that the Vac of the hydrogen ions for fabricating a nano SOI wafer is less than 30 keV.

Referring to FIGS. 2, 5, 8, and 10, the base wafer 20 and the bond wafer 10 are cleaned to remove contaminants from the surfaces of the wafers 20 and 10 and the wafers 20 and 10 are vertically bonded in step S36. Here, unlike to a conventional horizontal bonding method, at least one portion of the silicon oxide layer 12 of the bond wafer 10 contacts the base wafer 20 and the contacting area is increased in one direction to increase the contacting area. Here, since the surfaces of the base wafer 20 and the bond wafer 10 are rugged and the silicon wafer is an elastic material, the base wafer 20 and the bond wafer 10 are bonded while being pressurized in one direction. Consequently, contacting surfaces of the wafers 20 and 10 are planarized to push void elements, such as moisture, which may be formed between the contacting surfaces of the wafers 20 and 10 to the outside. Therefore, voids on the contacting surfaces can be remarkably reduced and a bonding force is improved.

Figure 8:
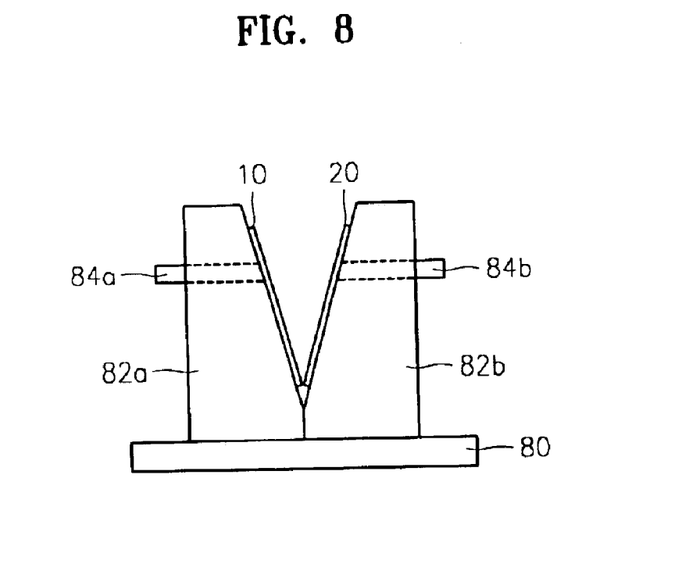
FIGS. 8 through 10 are schematic views illustrating a method for bonding a base wafer and a bond wafer to fabricate a nano SOI wafer according to the first embodiment of the present invention.
Figure 9:
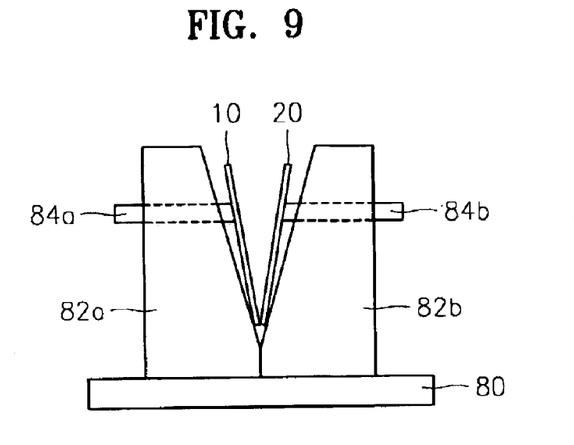
Figure 10:
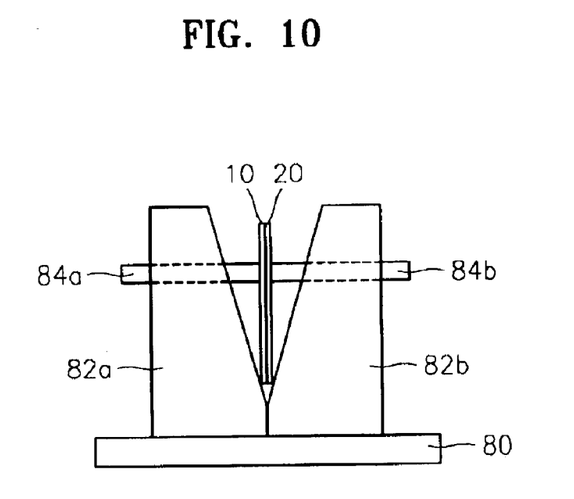

More specifically, referring to FIGS. 8 through 10, the base wafer 20 and the bond wafer 10 are mounted on wafer supporters 82a and 82b having slanting surfaces, respectively. Here, the wafer supporters 82a and 82b are fixed on a base 80 and mount units (not shown) having proper size and depth corresponding to the shapes of the wafers are formed on the slanting surfaces of the wafer supporters 82a and 82b in order to fix the wafers. Wafer pressing bars 84a and 84b are formed at the centers of the wafer supporters 82a and 82b to press the wafers 10 and 20 from rear surfaces of the wafers 10 and 20, respectively. Accordingly, the base wafer 10 and the bond wafer 20 are pressed and bonded according to the order shown in FIGS. 8 through 10.

It is preferable that the base wafer 20 and the bond wafer 10 are bonded at a room temperature. Here, the wafers 20 and 10 are bonded by a hydrogen bond under a hydrophillic condition.

Figure 6:
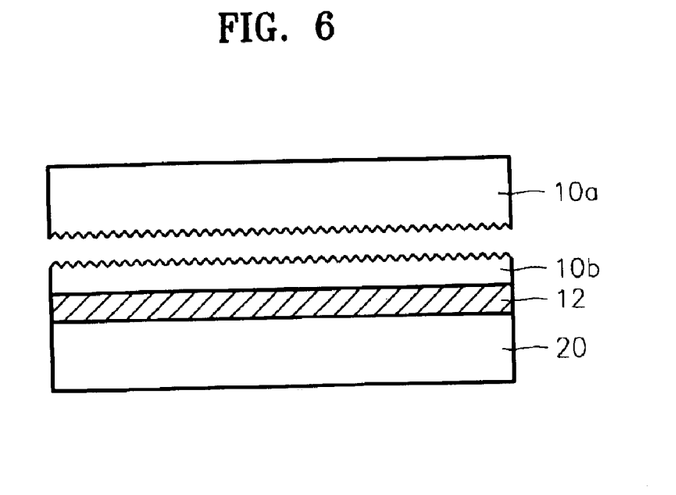
Figure 7:
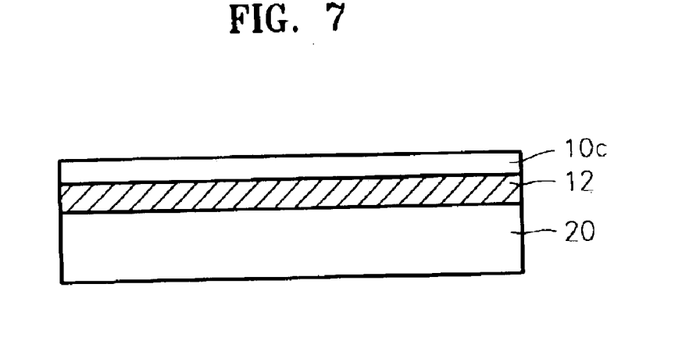

Referring to FIGS. 2 and 6, the hydrogen ion implantation portion 14 is cleaved by a thermal process performed at a low temperature in step S38. The thermal process is performed at a temperature of less than about 400° C. for more than about one minute. Here, bubbles in the hydrogen ion implantation portion 14 are interacted in the thermal process to form a sufficient amount of blisters and the blisters are spread to generate a flake occurrence so that the cleavage occurs. In the present embodiment, the rms value of the cleaved surface of the bond wafer 10 is maintained in a range from 30 to 40 Å and the thickness of a device region after the cleavage process is about 3000 Å.

Figure 14:
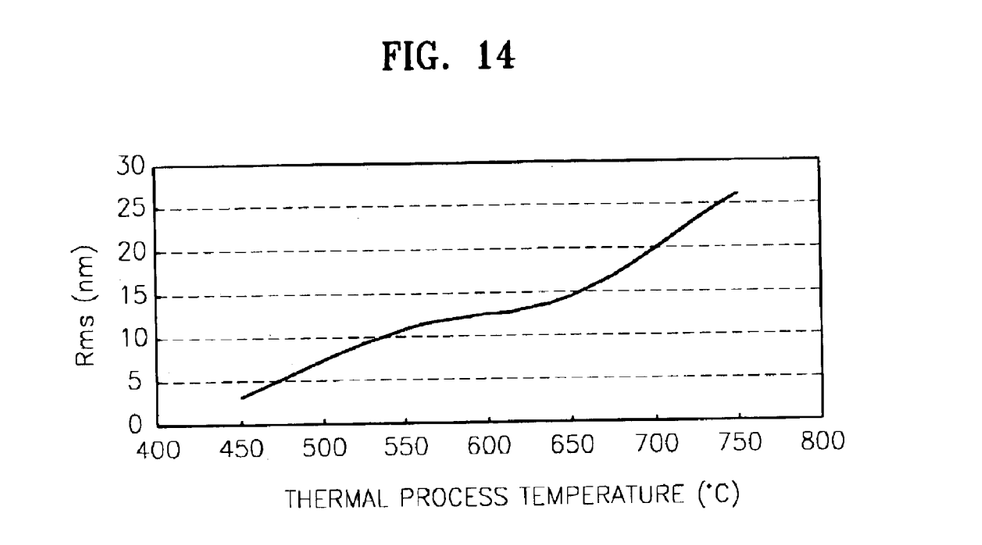
FIG. 14 is a graph illustrating a relationship between a thermal process temperature for cleaving a bond wafer and the rms value measured in an experiment for fabricating a nano SOI wafer according to the first embodiment of the present invention.

A subsequent experiment is performed in order to decide the thermal process temperature and the rms value for the cleavage. In the experiment, the Vac of the hydrogen ions is 28.5 KeV and the hydrogen ion dose amount is $5 \times 10^{16}$ cm$^{-2}$. FIG. 14 illustrates the experimental result measured by TEM.

In FIG. 14, the x-axis denotes the temperature for the thermal process and the y-axis denotes the rms. When the temperatures are 450° C., 550° C., 650° C., and 750° C., the rms values are about 3.15 nm, 10.9 nm, 14.5 nm, and more than 25.0 nm, respectively. When the temperature is 550° C., dislocation occurs on the cleaved surface. As the temperature of the thermal process increases, the dislocation grows and concentrates. The dislocation on the cleaved surface interferes a wet etching of the device region 10b of the bond wafer 10 in a subsequent process.

It is preferable that the temperature of the thermal process in the cleavage process is less than 450° C. considering the generation of dislocation and the rms value on the cleaved surface.

Figure 15:
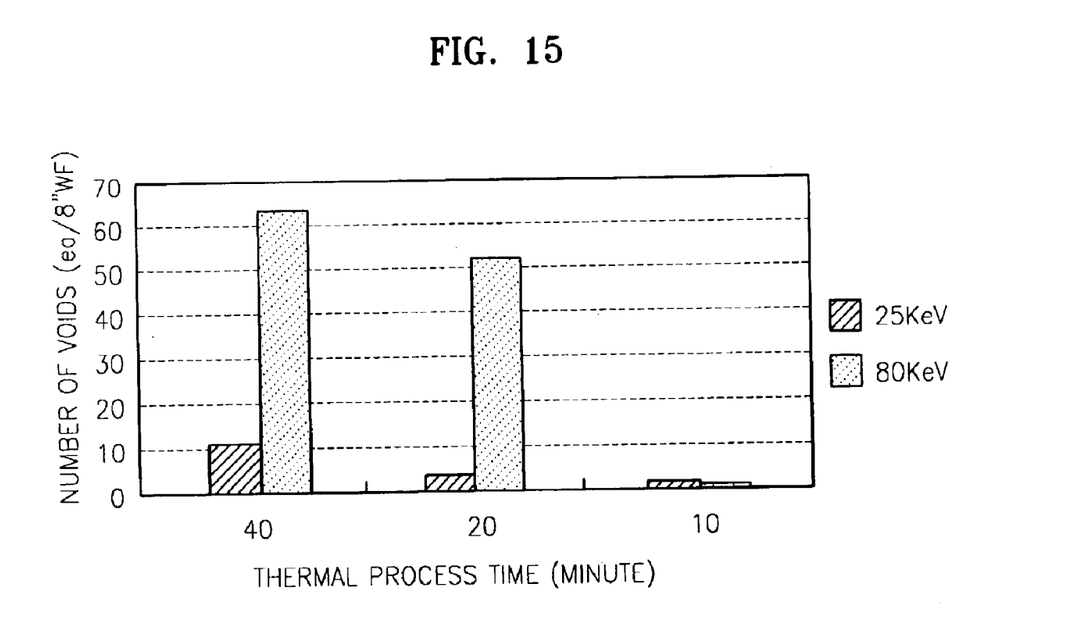
FIG. 15 is a graph illustrating a relationship between a thermal process temperature for cleaving a bond wafer and the number of voids measured in an experiment for fabricating a nano SOI wafer according to the first embodiment of the present invention.

FIG. 15 is a graph illustrating a relationship between a thermal process time and the number of voids on the cleaved surface in the cleavage process. Here, the temperature for the thermal processes is less than 450° C., and the Vacs for samples are 25 KeV and 80 KeV. In addition, the periods of time of the thermal processes are 10 minutes, 20 minutes, and 40 minutes. As shown in FIG. 15, although the cleavage processes are performed at a low temperature, the number of voids is reduced when the period of time of the thermal process is short.

Figure 16:
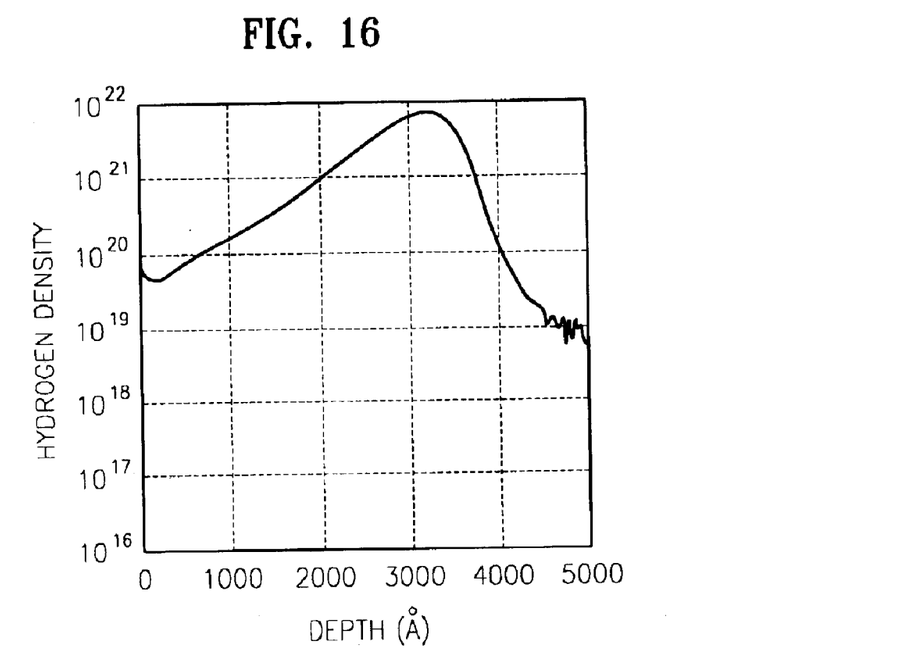
FIGS. 16 through 19 are graphs illustrating the change in the hydrogen density according to the depths in a wafer, while varying a thermal process temperature for cleaving a bond wafer in an experiment for fabricating a nano SOI wafer according to the first embodiment of the present invention.
Figure 17:
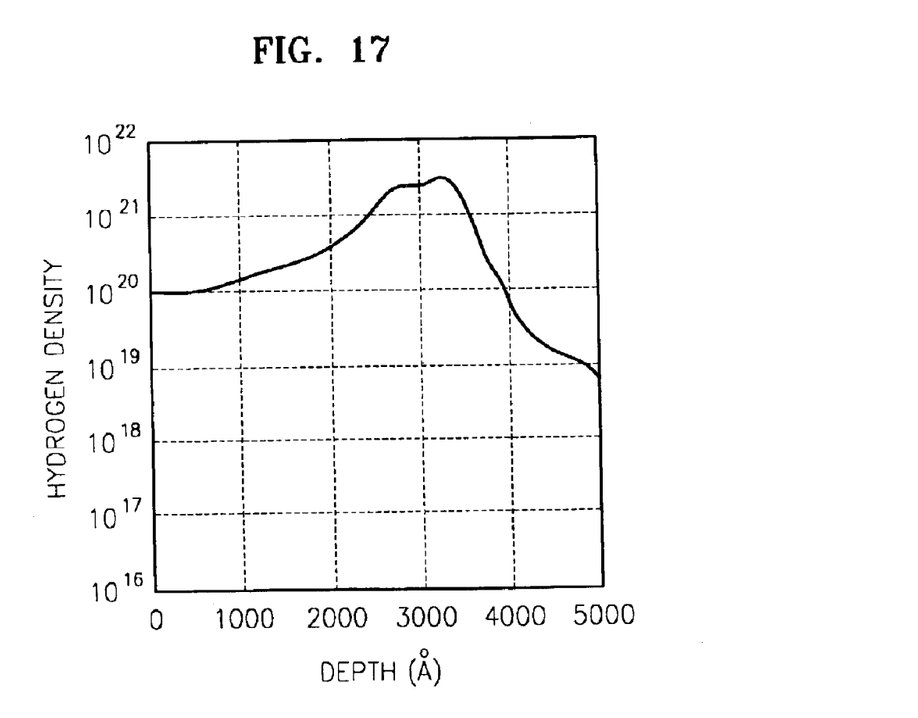
Figure 18:
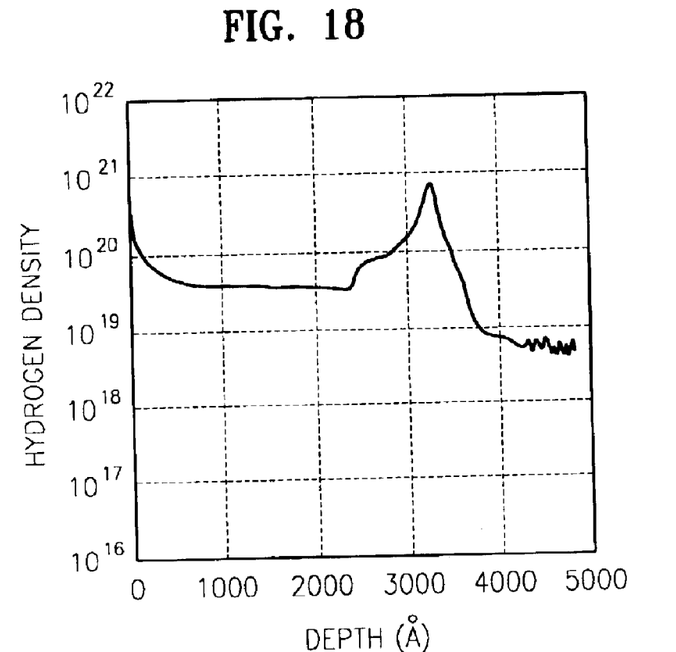
Figure 19:
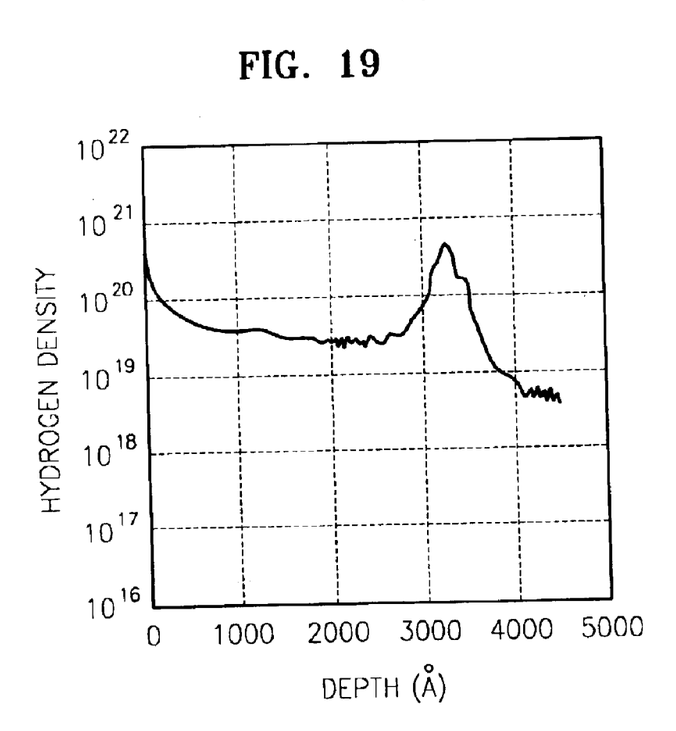

FIGS. 16 through 19 are graphs illustrating the change in the hydrogen density according to the depths in a wafer while varying the temperature for the thermal process in the cleavage process. Here, the Vac of ions is 26 KeV and the dose amount of hydrogen ions is $5 \times 10^{16}$ cm$^{-2}$. FIG. 16 is a graph illustrating a result when a thermal process has not been performed. FIGS. 17 through 19 are graphs illustrating results in which the thermal processes are performed at temperatures of 450° C., 650° C., and 750° C., respectively.

Based on the results of FIGS. 16 through 19, as the temperature of the thermal process in the cleavage process of the bond wafer 10 increases, the out-diffusion of the hydrogen ions is activated. Accordingly, in order to maintain the dose amount of the hydrogen ions for the generation of blisters and a flake occurrence, the dose amount of the hydrogen ions has to be increased according to the increase of the temperature of the thermal process in the cleavage process. Therefore, the producing cost increases and the rms value deteriorates as shown in FIG. 14. However, when the temperature of the thermal process is lowered, the out-diffusion of the hydrogen ions is small so that the cleavage occurs by using the small dose amount of the hydrogen ions.

Referring to FIG. 2, after the hydrogen ion implantation unit 14 of the bond wafer 10 is cleaved by using the thermal process of low temperature, the cleaved surface of the device region 10b is first hydrogen thermal processed in step S40. The first hydrogen thermal process is performed in a hydrogen atmosphere at a temperature of over 1100° C. for at least one minute. Thus, the rms value of the device region 10b is changed from 30 to 40 Å to less than 10 Å by the hydrogen thermal process.

Figure 20:
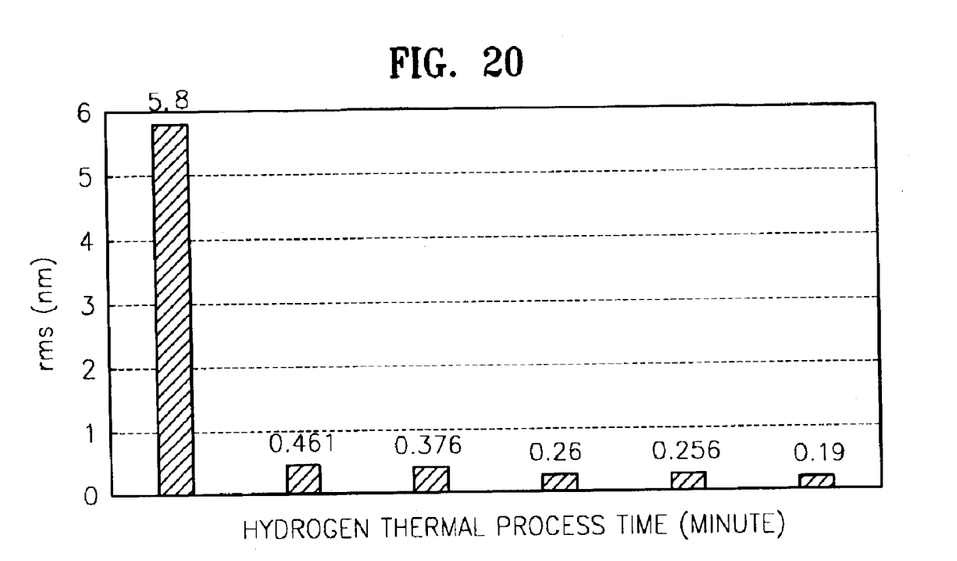
FIG. 20 is a bar graph illustrating a relationship between a hydrogen thermal process time for a cleaved surface of a wafer and the rms value measured in an experiment for fabricating a nano SOI wafer according to the first embodiment of the present invention.

FIG. 20 is a graph illustrating a relationship between a hydrogen thermal process time for the cleaved surface and the rms value. Here, the thermal process is performed at a temperature of 1135° C. It is known that as the thermal process time increases, the rms value considerably decreases.

Referring to FIG. 2 again, the cleaved surface of the device region 10b is wet etched in step S42 after the first hydrogen thermal process. Here, an etch solution including NH$_4$OH, H$_2$O$_2$, and H$_2$O in a ratio of 0.5:15 is used, and an etch temperature is in a range from 65° C. to 100° C. An etching time and an etch thickness are established considering the thickness of a final device region 10c (refer to FIG. 7). In the case of a nano SIO, the etching process is performed until the thickness of the device region 10c becomes less than 50 nm. In addition, the reasons for selecting the above etch solution in the present embodiment are that the etch solution has a low etching speed and an excellent evenness in the etch thickness after the etching process.

Figure 21:
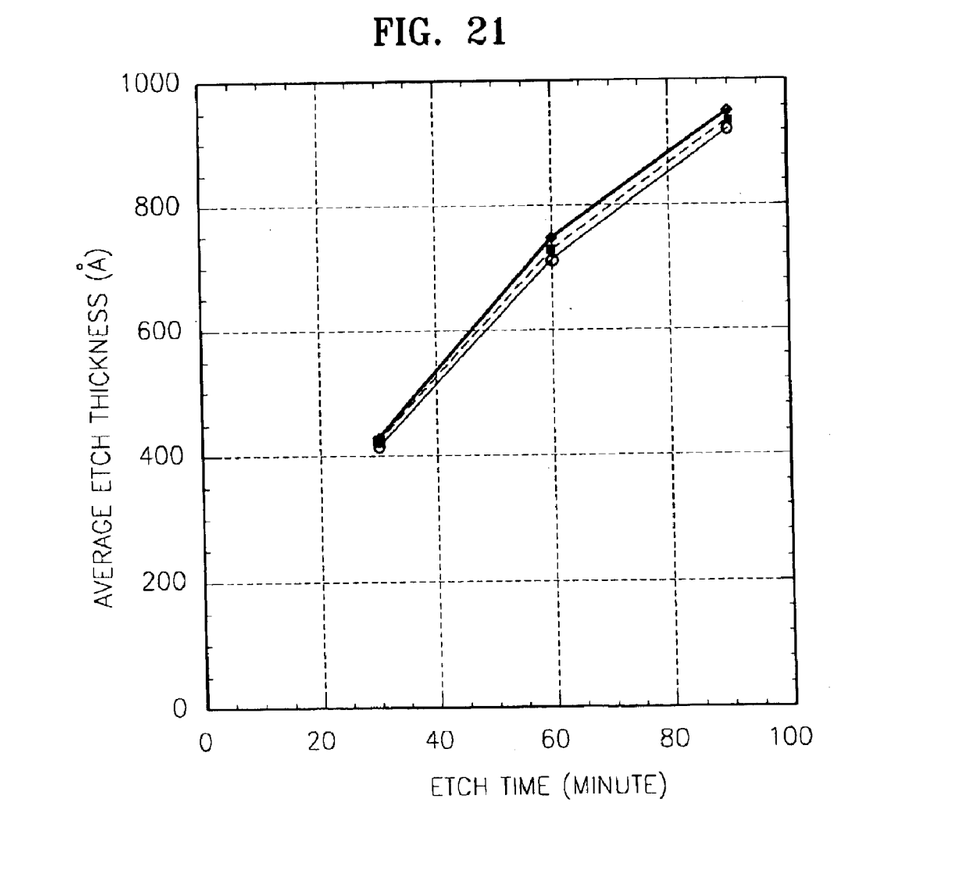
FIG. 21 is a graph illustrating a relationship between an etch time and an average etching amount measured in an experiment for fabricating a nano SOI wafer according to the first embodiment of the present invention.

FIG. 21 is a graph illustrating average etch thickness of three silicon samples according to the etch time. According to the graph, the average etch thickness increases proportional to the etch time. Therefore, the thickness of the device region 10c can be easily adjusted by controlling the etch time in the present invention.

Referring to FIG. 2 again, after the cleaved surface is etched, a second thermal process of the hydrogen ions is performed on the etched device region 10c in step S44. Here, the second thermal process is performed in the same manner as the first thermal process. When the second thermal process is finished, the rms value of the device region is maintained to be less than 2 Å, which is required by the nano SOI wafer.

Figure 11:
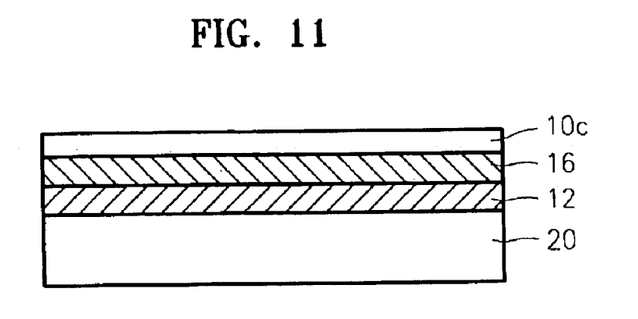
FIG. 11 is a sectional view illustrating a nano SOI wafer according to a second embodiment of the present invention.

FIG. 11 is a sectional view illustrating a nano SOI wafer according to a second embodiment of the present invention. Here, the only difference between the nano SOI wafers according to the first embodiment and the second embodiment is that the nano SOI wafer according to the second embodiment includes a silicon germanium layer 16 between the silicon oxide layer 12 and the device region 10c. The method of fabricating the nano SOI wafer according to the second embodiment is the same as the method of fabricating the nano SOI wafer according to the first embodiment of FIG. 7 except for a process for forming a silicon germanium layer 16. In other words, referring to FIG. 2, the silicon germanium layer 16 is formed on the surface of the bond wafer 10 by an epitaxial process before the silicon oxide layer 12 is formed on the surface of the bond wafer 10. In addition, in implanting hydrogen ions into the bond wafer 10, a hydrogen ion implantation unit is formed under the silicon germanium layer 16.

While this invention has been particularly shown and described with reference to preferred embodiments thereof, it will be understood by those skilled in the art that various changes in form and details may be made therein without departing from the spirit and scope of the invention as defined by the appended claims.

According to the present invention, the Rp of hydrogen ions and ΔRp are reduced according to the ion implantation at a low voltage so that an rms value on the cleaved surface is reduced in a cleavage process. Therefore, a nano device region can be formed by a thermal process of the hydrogen ions and a wet etching while not performing a CMP process.

According to the present invention, a bond wafer and a base wafer are bonded while increasing the contacting area of the wafers so that the number of voids on the contacting surface is reduced to improve bonding force of the wafers.

In addition, according to the present invention, the rms value on the cleaved surface is reduced by performing a cleavage process at a low temperature so that a nano scale device region is formed by using only the thermal process of the hydrogen ions and wet etching and the out-diffusion of the hydrogen ions is reduced. Therefore, flake occurrence can be generated by a small dose amount of hydrogen ions so that the producing cost is lowered.

Furthermore, the rms value on the cleaved surface is remarkably reduced by the thermal process of the hydrogen ions on the cleaved surface so that a desired surface roughness can be attained. In addition, since the thermal process of the hydrogen ions is additionally performed on the cleaved surface before the wet etching process, the wet etching process can be efficiently performed.

What is claimed is:

1. A method of fabricating a nano silicon on insulator (SOI) wafer, the method comprising:
    preparing a bond wafer formed of mono-crystalline silicon and a base wafer;
    forming a dielectric on at least one surface of the bond wafer;
    forming a hydrogen ion implantation unit by implanting hydrogen ions into the mono-crystalline silicon of the bond wafer to a predetermined depth from the surface of the bond wafer at a voltage of less than 30 KeV;
    contacting and bonding the dielectric of the bond wafer and the base wafer;
    performing a thermal process at a temperature of less than 400° C. to cleave the hydrogen ion implantation unit of the bond wafer;
    performing a first hydrogen thermal process on a cleaved surface of a device region bonded to the base wafer to reduce the root mean square roughness (rms) value of the cleaved surface of the device region; and
    wet etching the cleaved surface of the device region until the thickness of the device region becomes less than a nano scale of 50 nm to form a nano scale device region.

2. The method of claim 1, wherein the bond wafer is a mono-crystalline silicon wafer and the dielectric formed on the bond wafer is a silicon oxide layer formed by a thermal process.

3. The method of claim 1, wherein the projection range distance (Rp) of the implanted hydrogen ions is formed in a range from about 1000 Å to about 4000 Å from the surface of the bond wafer.

4. The method of claim 1, wherein the bond wafer and the base wafer are bonded by contacting portions of the bond wafer and the base wafer in the edge regions of the bond wafer and the base wafer, and sequentially increasing the contacting area to bond the wafers.

5. The method of claim 4, wherein the bond wafer and the base wafer are bonded at a room temperature.

6. The method of claim 4, wherein the bond wafer and the base wafer are bonded by contacting lower portions of the bond wafer and the base wafer and sequentially increasing the contacting area in an upper direction to press and bond the wafers.

7. The method of claim 1, wherein the root mean square roughness (rms) value on the cleaved surface of the bond wafer is from about 30 Å to about 40 Å.

8. The method of claim 1, wherein the bond wafer bonded to the base wafer is maintained at a thickness of less than about 3000 Å in cleaving the bond wafer.

9. The method of claim 1, further comprising, after the step of wet etching the cleaved surface of the device region,
    performing a second hydrogen thermal process on the surface of the wet etched device region.

10. The method of claim 9, wherein the second hydrogen thermal process is performed on the surface of the device region at a temperature of more than about 1100° C. for at least one minute.

11. The method of claim 1, wherein the first hydrogen thermal process is performed on the surface of the device region at a temperature of more than about 1100° C. for at least one minute.

12. The method of claim 1, wherein the cleaved surface of the device region is wet etched by using a mixed solution of $NH_4OH$, $H_2O_2$, and $H_2O$ as an etch solution.

13. A method of fabricating a nano silicon on insulator (SOI) wafer, the method comprising:
    preparing a bond wafer formed of mono-crystalline silicon and a base wafer;
    forming a silicon germanium layer on at least one surface of the bond wafer;
    forming a dielectric on the silicon germanium layer;
    forming a hydrogen ion implantation unit by implanting hydrogen ions into the mono-crystalline silicon of the bond wafer to a predetermined depth from the surface of the bond wafer at a voltage of less than 30 KeV;
    contacting and bonding the dielectric of the bond wafer and the base wafer;

performing a thermal process to cleave the hydrogen ion implantation unit of the bond wafer process at a temperature of less than 400° C.;

performing a first hydrogen thermal process on a cleaved surface of a device region bonded to the base wafer to reduce the root mean square roughness (rms) value of the cleaved surface of the device region; and wet etching the cleaved surface of the device region until the thickness of the device region becomes less than a nano scale of 50 nm to form a nano scale device region.

14. The method of claim 13, wherein the silicon germanium layer is formed on the bond wafer by an epitaxial process.

15. The method of claim 13, wherein the dielectric formed on the silicon germanium layer is a silicon oxide layer formed by a thermal process.

16. The method of claim 13, wherein the projection range distance (Rp) of the implanted hydrogen ions is formed in a range from about 1000 Å to about 4000 Å from the surface of the bond wafer.

17. The method of claim 13, wherein the bond wafer and the base wafer are bonded by contacting portions of the bond wafer and the base wafer in the edge regions of the bond wafer and the base wafer, and sequentially increasing the contacting area to bond the wafers.

18. The method of claim 17, wherein the bond wafer and the base wafer are bonded at a room temperature.

19. The method of claim 18, wherein the bond wafer and the base wafer are bonded by contacting lower portions of the bond wafer and the base wafer, and sequentially increasing the contacting area in an upper direction to press and bond the wafers.

20. The method of claim 13, wherein the root mean square roughness (rms) value on the cleaved surface of the bond wafer is from about 30 Å to about 40 Å.

21. The method of claim 13, wherein the bond wafer bonded to the base wafer is maintained at a thickness of less than about 3000 Å in cleaving the bond wafer.

22. The method of claim 13, further comprising, after the step of wet etching the cleaved surface of the device region, performing a second hydrogen thermal process on the surface of the wet etched device region.

23. The method of claim 22, wherein the second hydrogen thermal process is performed on the surface of the device region at a temperature of more than about 1100° C. for at least one minute.

24. The method of claim 13, wherein the first hydrogen thermal process is performed on the surface of the device region at a temperature of more than about 1100° C. for at least one minute.

25. The method of claim 13, wherein the cleaved surface of the device region is wet etched by using a mixed solution of $NH_4OH$, $H_2O_2$, and $H_2O$ as an etch solution.

26. The method of claim 25, wherein a ratio of the mixed solution of $NH_4OH$, $H_2O_2$, and $H_2O$ is 0.5:1:5.

27. The method of claim 13, wherein the temperature of the wet etching is in a range from 65° C. to 100° C.

* * * * *